(12) United States Patent
Cho et al.

(10) Patent No.: US 7,378,071 B2
(45) Date of Patent: *May 27, 2008

(54) SILICON WAFER AND METHOD FOR PRODUCING SILICON SINGLE CRYSTAL

(75) Inventors: Hyon-Jong Cho, Gumi-si (KR); Cheol-Woo Lee, Gumi-Si (KR); Hong-Woo Lee, Gumi-Si (KR); Cheong Jin Soo, Seoul (KR); Kim Sunmi, Seoul (KR)

(73) Assignee: Siltron Inc., Kumi (KR)

( * ) Notice: Subject to any disclaimer, the term of this patent is extended or adjusted under 35 U.S.C. 154(b) by 166 days.

This patent is subject to a terminal disclaimer.

(21) Appl. No.: 11/178,096

(22) Filed: Jul. 7, 2005

(65) Prior Publication Data

US 2006/0016386 A1    Jan. 26, 2006

Related U.S. Application Data

(62) Division of application No. 10/741,746, filed on Dec. 19, 2003, now Pat. No. 7,229,495.

(30) Foreign Application Priority Data

Dec. 23, 2002  (KR)  ............... 10-2002-0082733
Nov. 17, 2003  (KR)  ............... 10-2003-0080998

(51) Int. Cl.
   *C01B 33/26*   (2006.01)
   *C30B 15/20*   (2006.01)

(52) U.S. Cl. ............... 423/328.2; 117/13; 117/19; 117/20

(58) Field of Classification Search ............ 117/13, 117/19, 20; 423/328.2, 358.2
See application file for complete search history.

(56) References Cited

U.S. PATENT DOCUMENTS 6,113,688 A     9/2000  Kawanishi et al.

(Continued)

FOREIGN PATENT DOCUMENTS

KR    2002-0011956    2/2002

(Continued)

OTHER PUBLICATIONS

Korean Patent Abstract, Publication No. 1020020018904, Published on Mar. 9, 2002, in the name of Cho, et al.

(Continued)

*Primary Examiner*—Felisa C Hiteshew
(74) *Attorney, Agent, or Firm*—Christie, Parker & Hale, LLP

(57) ABSTRACT

A method for growing a silicon single crystal ingot by a Czochralski method, which is capable of providing silicon wafers having very uniform in-plane quality and which results in improvement of semiconductor device yield. A method is provided for producing a silicon single crystal ingot by a Czochralski method, wherein when convection of a silicon melt is divided into a core cell and an outer cell, the silicon single crystal ingot is grown under the condition that the maximal horizontal direction width of the core cell is 30 to 60% of a surface radius of the silicon melt. In one embodiment the silicon single crystal ingot is grown under the condition that the maximal vertical direction depth of the core cell is equal to or more than 50% of the maximal depth of the silicon melt.

6 Claims, 8 Drawing Sheets

U.S. PATENT DOCUMENTS

| | | |
|---|---|---|
| 6,527,859 B2 | 3/2003 | Lee et al. |
| 6,574,264 B2 | 6/2003 | Lee et al. |
| 6,592,662 B2 * | 7/2003 | Fusegawa et al. ............ 117/13 |
| 6,858,077 B2 | 2/2005 | Lee et al. |
| 6,869,478 B2 | 3/2005 | Nakamura et al. |
| 6,899,759 B2 | 5/2005 | Kishida et al. |

FOREIGN PATENT DOCUMENTS

| | | |
|---|---|---|
| KR | 2002-0018904 | 3/2002 |
| KR | 2002-0041203 | 6/2002 |

OTHER PUBLICATIONS

Patent Abstract of Korea, Publication No. 1020020041203, Published on Jun. 1, 2002, in the name of Cho, et al.

Korean Patent Abstracts, Publication No. 1020020011956 A, dated Feb. 9, 2002, in the name of Gon Seop Lee, et al.

Tomzig, E., et al., *Challenges for economical growth of high quality 300 mm CZ Si crystals*, Microelectronic Engineering, vol. 45, 1999, pp. 113-125.

Nakanishi, H., et al., *Dependence of Si melt flow in a crucible on surface tension variation in the Czochralski process*, Journal of Crystal Growth, vol. 236, 2002, pp. 523-528.

Kim, J. et al., *Numerical study of the effect of operating parameters on point defects in a silicon crystal during Czochralski growth I. Rotation effect*, Journal of Crystal Growth, vol. 219, 2000, pp. 205-217.

Kawanishi, S., et al., *Melt quenching technique for direct observation of oxygen transport in the Czochralski-grown Si process*, Journal of Crystal Growth, vol. 152, 1995, pp. 266-273.

Virbulis, J., et al., *Numerical investigation of silicon melt flow in large diameter CZ-crystal growth under the influence of steady and dynamic magnetic fields*, Journal of Crystal Growth, vol. 230, 2001, pp. 92-99.

Vizman, D., et al., *Comparison of the predictions from 3D numerical simulation with temperature distributions measure in Si Czochralski melts under the influence of different magnetic fields*, Journal of Crystal Growth, vol. 230, 2001, pp. 73-80.

* cited by examiner

SILICON WAFER AND METHOD FOR PRODUCING SILICON SINGLE CRYSTAL

CROSS REFERENCE TO RELATED APPLICATIONS

This application is a divisional of U.S. application Ser. No. 10/741,746, filed Dec. 19, 2003 now U.S. Pat. No. 7,229,495, which claims priority to and the benefit of Korea Patent Applications No. 2002-0082733 filed on Dec. 23, 2002 and No. 2003-0080998 filed on Nov. 17, 2003, both in the Korean Intellectual Property Office, priority of which are claimed herein.

BACKGROUND OF THE INVENTION (a) Field of the Invention

The present invention relates to a method for growing a silicon single crystal ingot based on a Czochralski method, and more particularly to a method of growing a silicon single crystal ingot for producing silicon wafers having uniform in-plane quality.

(b) Description of the Related Art

In general, methods for growing a silicon single crystal ingot based on a Czochralski method use a grower as shown in FIG. 1, which is a sectional view showing the inside of a general grower for silicon single crystal ingots. As shown in FIG. 1, poly-crystalline silicon is loaded into quartz crucible 10 and melted into silicon melt SM by heat irradiated from heater 30, and then silicon single crystal ingot IG is grown from a surface of silicon melt SM.

When silicon single crystal ingot IG is grown, quartz crucible 10 is ascended such that a solid-liquid interface maintains the same height while rotating an axis 20 supporting quartz crucible 10, and silicon single crystal ingot IG is pulled up while rotating it in an opposite direction to that of quartz crucible 10 with the same axis center as the rotation axis of quartz crucible 10.

In addition, to facilitate silicon single crystal ingot growth, an inert gas such as Ar gas can be generally injected into a grower and then discharged from the grower.

In such conventional silicon single crystal ingot production methods, heat shield 40 and a cooling-water jacket (not shown) for adjusting a temperature gradient of silicon single crystal ingot IG is installed. Conventional techniques using the heat shield are disclosed in Korean Patent Registration No. 374703, Korean Patent Application No. 2000-0071000, and U.S. Pat. No. 6,527,859.

However, there is a limit to production of a silicon single crystal ingot and silicon wafers having uniform quality in a radial direction when only adjusting the temperature gradient of silicon single crystal ingot IG. Therefore, there is a keen need for new techniques for producing the silicon single crystal ingot and silicon wafers having uniform quality in a radial direction.

In particular, when semiconductor devices are fabricated using silicon wafers having nonuniform quality in a radial direction, which are prepared according to the conventional techniques, the nonuniformity of quality of the silicon wafers is increased when the silicon wafers are heat-treated several times in a fabrication process of the semiconductor device. This results in a reduction of semiconductor device yield.

SUMMARY OF THE INVENTION

In accordance with the present invention, a silicon single crystal ingot is provided which has uniform quality in a radial direction so that silicon wafers having uniform in-plane quality can be produced.

The present invention has one motivation to determine critical process variables for growing a silicon single crystal ingot having uniform quality in a radial direction.

The present invention has another motivation to determine optimal process conditions for growing a silicon single crystal ingot having uniform quality in a radial direction.

The present invention has still another motivation to improve semiconductor device yield by producing silicon wafers having uniform in-plane quality.

There is provided a method for producing a silicon single crystal ingot by a Czochralski method, which is capable of uniformly controlling quality characteristics such as oxygen and point defect distributions contained in the silicon single crystal ingot and silicon wafers by effectively controlling convection distribution of a silicon melt within a quartz crucible such that distribution of oxygen and heat in the vicinity of a solid-liquid interface where a silicon melt is crystallized become uniform.

According to an aspect of the present invention, there is provided a method for producing a silicon single crystal ingot by a Czochralski method, wherein when convection of a silicon melt is divided into a core cell and an outer cell, the silicon single crystal ingot is grown under the condition that the maximal horizontal direction width of the core cell is 30 to 60% of a surface radius of the silicon melt.

In an exemplary embodiment the silicon single crystal ingot is grown under the condition that the maximal vertical direction depth of the core cell is equal to or more than 50% of the maximal depth of the silicon melt.

In an exemplary embodiment the silicon single crystal ingot is grown under the condition that the maximal vertical direction depth of the core cell is 80 to 95% of the maximal depth of the silicon melt.

In an exemplary embodiment the width or depth of the core cell is controlled by adjusting an amount of inflow of Ar gas flowing into the inside of a silicon single crystal ingot growth apparatus, a rotation speed of a quartz crucible containing the silicon melt, or a rotation speed of the silicon single crystal ingot.

Specifically, the width or depth of the core cell is increased when the amount of inflow of the Ar gas is increased, the rotation speed of the quartz crucible is decreased, or the rotation speed of the silicon single crystal ingot under growth is increased.

According to another aspect of the present invention, a silicon wafer is provided wherein a standard deviation of in-plane interstitial oxygen concentration distribution is equal to or less than 0.1 ppma.

In an exemplary embodiment, point defect concentration contained in the silicon wafer is $10^{11}$-$10^{13}$/cm$^3$.

In an exemplary embodiment an in-plane variation of delta interstitial oxygen concentration (delta [Oi]), which is a difference between interstitial oxygen concentration after first heat-treating the silicon wafer at a temperature of 800° C. for 4 hours in an atmosphere of 95% nitrogen and 5% oxygen and then heat-treating the silicon wafer at a temperature of 1000° C. for 16 hours in an atmosphere of 95% nitrogen and 5% oxygen, and interstitial oxygen concentration before the first heat-treatment, is equal to or less than 0.5 ppma (parts per million atoms) (or 0.25×10$^{17}$/cm$^3$).

In an exemplary embodiment a difference between maximum and minimum of scale bars in an image obtained by minority carrier life time (MCLT) scanning, after first heat-treating the silicon wafer at a temperature of 800° C. for 4 hours in an atmosphere of 95% nitrogen and 5% oxygen and then heat-treating the silicon wafer at a temperature of 1000° C. for 16 hours in an atmosphere of 95% nitrogen and 5% oxygen, is equal to or less than 10.

In an exemplary embodiment the difference between maximum and minimum of scale bars in an image obtained by a MCLT scanning after the first and second heat-treatments is equal to or less than 5, and in a further embodiment, 3.

According to still another aspect of the present invention, there is provided a silicon single crystal ingot wherein a standard deviation of interstitial oxygen concentration distribution in a radial direction of the silicon single crystal ingot is equal to or less than 0.1 ppma.

In an exemplary embodiment a concentration of point defects contained in the silicon single crystal ingot produced according to the method of the present invention is $10^{11}$-$10^{13}$/cm$^3$.

DETAILED DESCRIPTION

Exemplary embodiments of the present invention will now be described in detail with reference to the accompanying drawings.

The present invention pays attention to the fact that convection distribution of a silicon melt should be controlled in order to grow a silicon single crystal ingot having uniform quality in a radial direction, starting from the perception that growth of the silicon single crystal ingot having the uniform quality in the radial direction-based on the Czochralski method is not achieved only by an adjustment of a temperature gradient in the ingot and an adjustment of shape of a solid-liquid interface.

Figure 1:
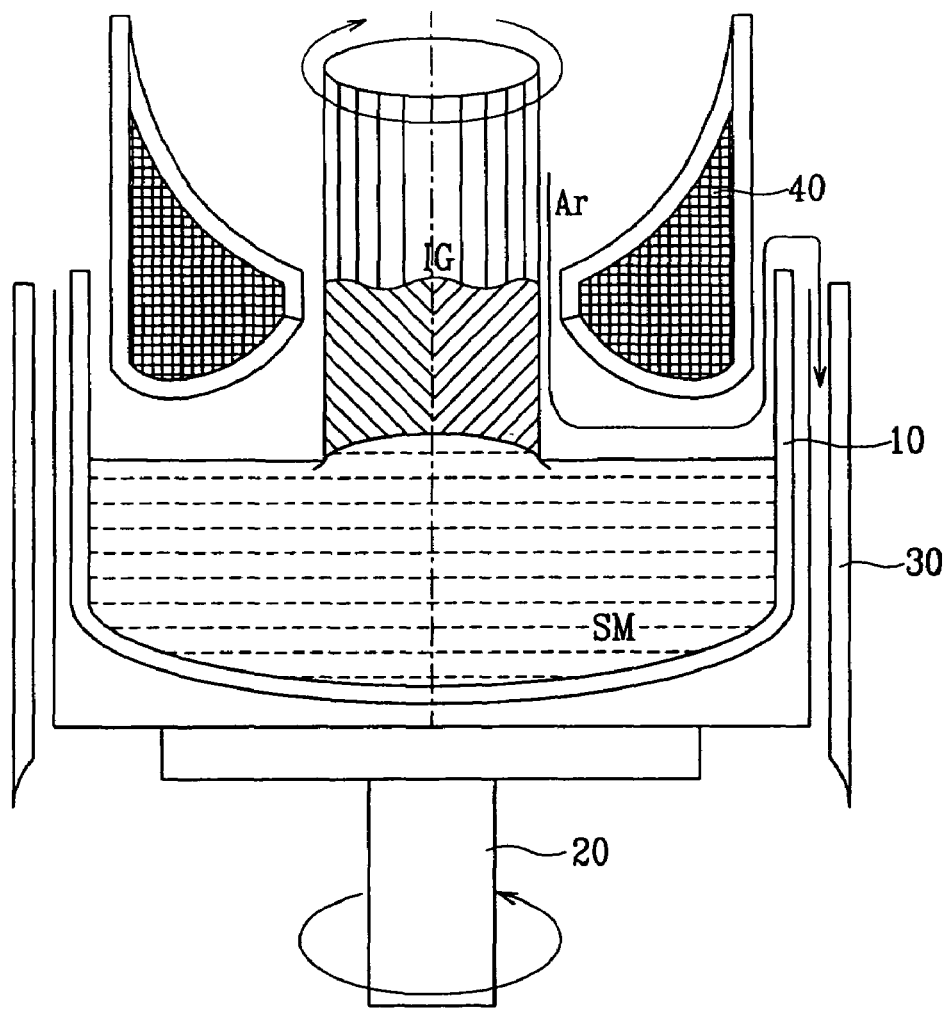
FIG. 1 is a sectional view showing the inside of a general silicon single crystal ingot growth apparatus.
Figure 2:
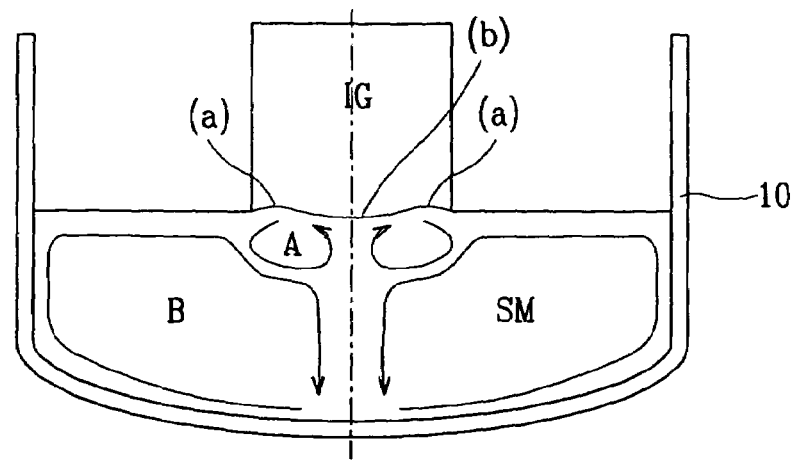
FIG. 2 is a schematic view showing convection distribution of silicon melt SM according to a conventional method.

FIG. 2 is a schematic view showing convection distribution of silicon melt SM according to a conventional method. When silicon single crystal ingot IG is grown according to the conventional method, the silicon melt SM has convection distributions A and B as shown in FIG. 2.

Specifically, the convection distributions of silicon melt SM are largely divided into an outer cell B where silicon melt SM is circulated in a way that the silicon melt follows a bottom and a side wall of quartz crucible 10, rises toward a surface of the silicon melt, and flows toward silicon single crystal ingot IG along the surface of the silicon melt, and core cell A where silicon melt SM is circulated in a lower adjacent portion of silicon single crystal ingot IG along an inner incline plane of outer cell B.

At this time, since the width of core cell A does not deviate from an edge of silicon single crystal ingot IG and the depth of core cell A does not reach half of the maximal depth of the silicon melt, the size of core cell A is relatively even smaller than that of outer cell B. In the prior art, silicon single crystal ingot IG is grown under the state that the size of core cell A is very small without special efforts to enlarge the size of core cell A.

Under such circumstances, as described in Gawanishi et al., "Melt quenching technique for direct observation of oxygen transport in the Czochralski-grown Si process", Journal of Crystal Growth, Vol. 152, 1995, pp 266-273, since oxygen contained in outer cell B causes an unstable balance of interstitial oxygen concentration between the center portion and the edge portion of the ingot, the distribution of interstitial oxygen concentration at the vicinity of a solid-liquid interface becomes nonuniform.

In addition, as heat distribution become nonuniform due to a difficulty in sufficient heat supply to the solid-liquid interface, the solid-liquid interface forms convex shape (a) curved toward the silicon single crystal ingot in an edge portion of the solid-liquid interface, and concave shape (b) curved toward the silicon melt in a center portion of the solid-liquid interface. Therefore, the silicon single crystal ingot IG was grown under the state that the solid-liquid interface had a nonuniform interface of convex (a)-concave (b)-convex (a) shapes as a whole.

The silicon wafer, which is sliced and polished from the silicon single crystal ingot IG grown by the above-described conventional method, exhibits a nonuniform quality characteristic in a radial direction of the silicon wafer.

Figure 3:
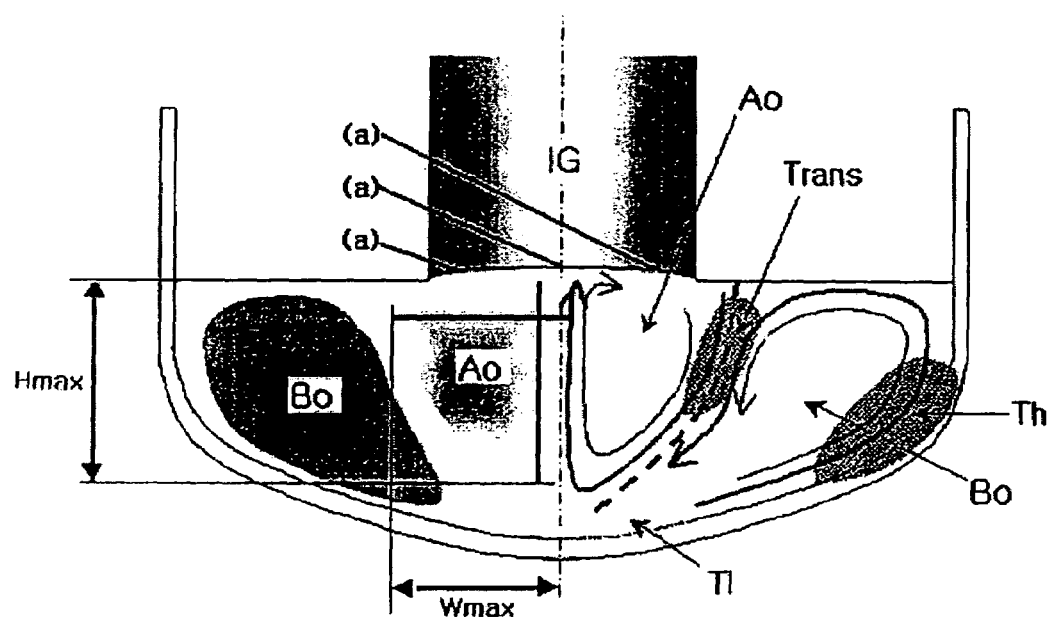
FIG. 3 is a schematic view showing convection distribution of silicon melt SM according to the present invention.

FIG. 3 is a schematic view showing convection distribution of silicon melt SM according to an embodiment of the present invention. As shown in FIG. 3, when convection of the silicon melt within the quartz crucible is divided into core cell Ao and outer cell Bo, convection distribution of the silicon melt is controlled such that maximal horizontal direction width Wmax of core cell Ao is 30 to 60% of a surface radius of the silicon melt.

In addition to the control of the maximal horizontal direction width of core cell Ao, the convection distribution of the silicon melt is controlled such that maximal vertical direction depth Hmax of core cell Ao of the silicon melt convection distribution is equal to or more than 50% of the maximal depth of the silicon melt.

At this time, the convection distribution of the silicon melt is preferable controlled such that maximal vertical direction depth Hmax of core cell Ao is 80 to 95% of the maximal depth of the silicon melt.

As described above, when maximal horizontal direction width Wmax and maximal vertical direction depth Hmax of the convection of the silicon melt, particularly, core cell Ao, are controlled to have appropriate sizes, the solid-liquid interface can be made such that it has a convex (a)-convex (a)-convex (a) shape curved toward the silicon single crystal ingot, i.e., a single convex shape.

In addition, as described above, by appropriately controlling the sizes of core cell Ao and outer cell Bo, the silicon melt existing in low temperature region TI of the bottom of the quartz crucible moves to high temperature region Th of a lower portion of a side wall of the quartz crucible along outer cell Bo, is supplied with sufficient heat from high temperature region Th, and then moves to silicon single crystal ingot IG along a surface of the silicon melt. In other words, the cold silicon melt in low temperature region TI having an effect on the solid-liquid interface by rising straight along core cell Ao can be prevented.

In addition, as an interface between core cell Ao and outer cell Bo is widely formed, heat exchanging region Trans, where high temperature heat from outer cell Bo is transferred to core cell Ao, is widely formed. Therefore, stable convection of core cell Ao and outer cell Bo can be achieved along with active heat exchange between core cell Ao and outer cell Bo.

A silicon wafer can then be sliced and polished from the silicon single crystal ingot IG grown by the above-described the method in accordance with the present invention. The resulting silicon wafer would then have a standard deviation of in-plane initial interstitial oxygen concentration [Oi], which is equal to or less than 0.1 ppma.

Here, a smaller standard deviation of in-plane initial interstitial oxygen concentration [Oi] means more uniform distribution of the interstitial oxygen concentration. A standard deviation of 0 means that the in-plane interstitial oxygen concentration is completely uniform, which is the most ideal case. Therefore, it is meaningless to define the lowest limit of the standard deviation, and a smaller standard deviation is desirable.

In addition, when the interstitial oxygen concentration is measured after the silicon wafer prepared according to the present invention is first heat-treated at a temperature of 800° C. for 4 hours and is then heat-treated at a temperature of 1000° C. for 16 hours in an atmosphere of 95% nitrogen and 5% oxygen as heat-treatment conditions, from which oxygen precipitation results (reaction: $Si_{si}+2O_i+V_{si} \rightarrow SiO_2$), a delta [Oi] indicating a difference between interstitial oxygen concentration before heat-treatment and that after heat-treatment has a variation which is equal to or less than 0.5 ppma in a wafer plane.

Here, the first and second heat-treatments is an example of a heat-treatment cycle for confirming an oxygen precipitation characteristic of the silicon wafer dependent on the interstitial oxygen concentration and point defect distribution. However, the present invention is not limited to this heat-treatment cycle.

A smaller variation of in-plane delta [Oi], which is desirable, means more uniform quality of a silicon wafer. A variation of in-plane delta [Oi] of 0 shows an ideal case. Therefore, it is meaningless to define the lowest limit of the standard deviation.

Further, a difference between a maximum and minimum of a scale bar in an image obtained as a result of MCLT scanning after first heat-treating the silicon wafer prepared according to the present invention at a temperature of 800° C. for 4 hours in an atmosphere of 95% nitrogen and 5% oxygen and then heat-treating the silicon wafer at a temperature of 1000° C. for 16 hours in the same atmosphere, is equal to or less than 10.

MCLT scanning of the wafer results in the distribution of the MCLT values, which are measured at all the in-plane positions of the wafer. The top 10% and the bottom 10% portions of the MCLT distribution are discarded. In the remaining distribution, the highest MCLT value is determined as the maximum value, and the lowest MCLT value is determined as the minimum value.

MCLT scanning is described in detail in Korean Patent Registration No. 246816, a more detailed explanation of which is omitted herein.

Particularly, the difference between maximum and minimum values of the scale bar in the image obtained as a result of MCLT scanning can be controlled to be equal to or less than 5, and more preferably, 3.

Here, a smaller difference between the maximum and minimum values of the scale bar in the image obtained as a result of MCLT scanning means more uniform distribution of values of the MCLT within the silicon wafer. A difference between maximum and minimum values of the scale bar of 0 means that the in-plane MCLTs are the same, which is the most ideal case. Therefore, it is meaningless to define the lowest limit of the difference between maximum and minimum values of the scale bar, and a smaller difference between maximum and minimum scale bars is desirable.

In this way, the control of the sizes of the maximal horizontal direction width and the maximal vertical direction depth of the core cell in the silicon melt convection to provide a silicon wafer having uniform in-plane quality can be achieved by adjusting an amount of inflow of Ar gas flowing into the inside of the silicon single crystal ingot growth apparatus, a rotation speed of the quartz crucible, or a rotation speed of the silicon single crystal ingot.

At this time, optimal process variables for the growth of the silicon single crystal ingot having the uniform quality in the radial direction are not limited to only the amount of inflow of the Ar gas, the rotation speed of the quartz crucible, or the rotation speed of the silicon single crystal ingot. Other appropriate process variables can be employed depending on a diameter of a silicon single crystal ingot to be grown, a volume of a quartz crucible, a desired quality of a wafer, etc.

The following experimental examples show an effect of the amount of inflow of the Ar gas, the rotation speed of the quartz crucible, and the rotation speed of the silicon single crystal ingot on the quality in the radial direction of the silicon single crystal ingot.

EXPERIMENTAL EXAMPLE 1

First, in growing the silicon single crystal ingot based on the Czochralski method, the convection distribution of the silicon melt was observed for a case (Ar1) in which an amount of inflow of Ar gas was 50 lpm (liter per min) and a case (Ar2) in which an amount of inflow of Ar gas was 100 lpm, under the conditions that the rotation speed of the quartz crucible was about 1.5 rpm (rotation per min) and the rotation speed of the silicon single crystal ingot was 18 rpm.

Figure 4A:
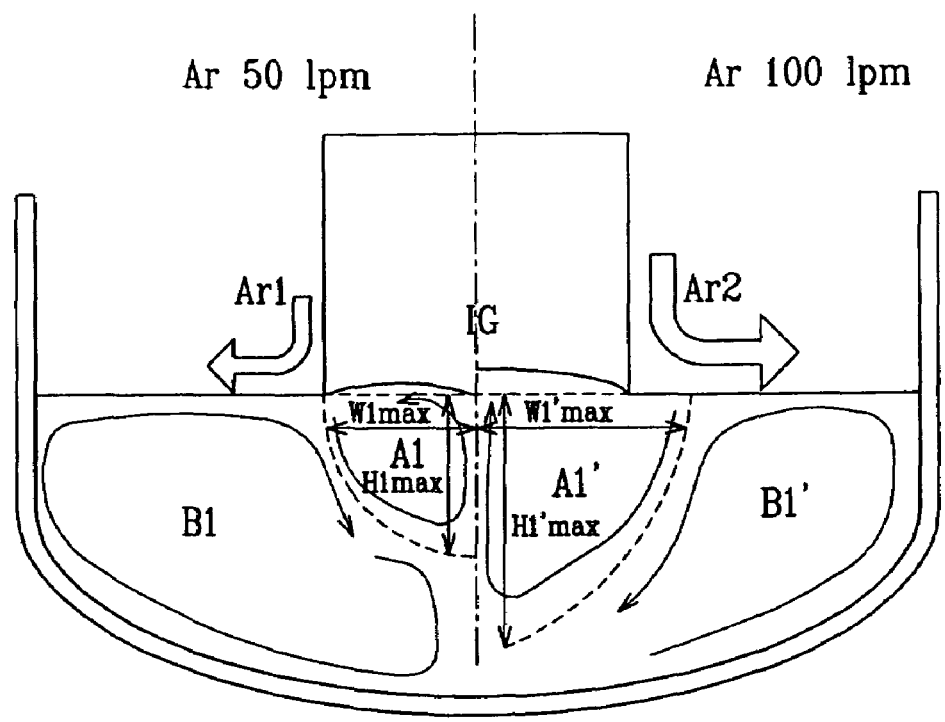
FIG. 4a is a schematic view showing convection distribution of a silicon melt in an experimental example 1.

FIG. 4a is a schematic view showing the convection distribution of the silicon melt in experimental example 1. As a result of experimental example 1, in the case (Ar1) that the amount of inflow of the Ar gas was 50 lpm, maximal horizontal direction width W1max of core cell A1 was not over an edge portion of the solid-liquid interface at which the silicon single crystal was grown, and maximal vertical direction depth H1max of core cell A1 was less than 50% of the maximal depth of the silicon melt, as shown in the left side of a center axis of the silicon single crystal ingot in FIG. 4a.

On the other hand, in the case (Ar2) that the amount of inflow of the Ar gas was 100 lpm, maximal horizontal direction width W1'max of core cell A1' was over an edge portion of the solid-liquid interface and occupied about 50% of the surface radius of the silicon melt, and maximal vertical direction depth H1'max of core cell A1' occupied about 80% of the maximal depth of the silicon melt, as shown in the right side of a center axis of the silicon single crystal ingot in FIG. 4a.

Therefore, it can be seen that the size of outer cell B1' in the right side became smaller than that of outer cell B1 in the left side.

Through experimental example 1 as described above, it can be seen that the size of the core cell of the convection distribution of the silicon melt can be enlarged by increasing the amount of inflow of the Ar gas flowing into the silicon single crystal ingot growth apparatus.

EXPERIMENTAL EXAMPLE 2

Next, the convection distribution of the silicon melt was observed for a case that the rotation speed of the quartz crucible was 4 rpm, and for a case that the rotation speed of the quartz crucible was 0.5 rpm, under the conditions that the amount of inflow of the Ar gas was 70 lpm and the rotation speed of the silicon single crystal ingot was 18 rpm. A result of the observation is shown in FIG. 4b.

Figure 4B:
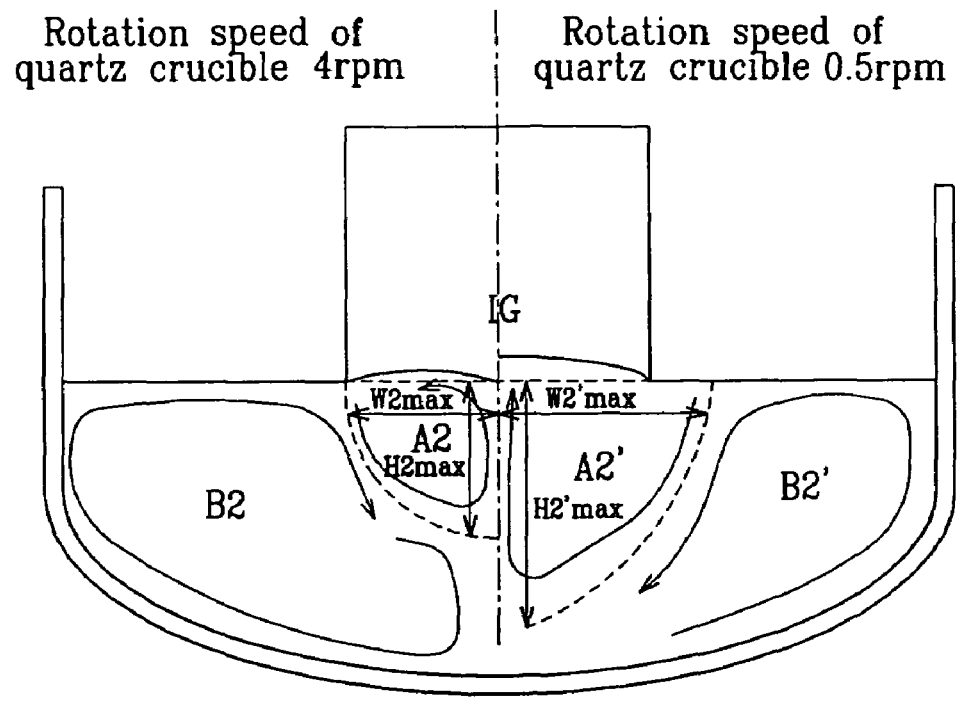
FIG. 4b is a schematic view showing convection distribution of a silicon melt in an experimental example 2.

In the case that the rotation speed of the quartz crucible was 4 rpm, maximal horizontal direction width W2max of core cell A2 was not over an edge portion of the silicon single solid-liquid interface and maximal vertical direction depth H2 max of core cell A2 was less than 50% of the maximal depth of the silicon melt, as shown in the left side of FIG. 4b.

On the other hand, in the case that the rotation speed of the quartz crucible was 0.5 rpm, maximal horizontal direction width W2'max of core cell A2' occupied about 50% of the surface radius of the silicon melt, and maximal vertical direction depth H2'max of core cell A2' occupied about 90% of the maximal depth of the silicon melt, as shown in the right side of FIG. 4b.

Therefore, it can be seen that the size of outer cell B2' in the right side gets smaller than that of outer cell B2 in the left side.

Through experimental example 2 as described above, it can be seen that the size of the core cell of the convection distribution of the silicon melt can be enlarged by decreasing the rotation speed of the quartz crucible, which is a part of the silicon single crystal ingot growth apparatus.

EXPERIMENTAL EXAMPLE 3

Next, the convection distribution of the silicon melt was observed for a case in which the rotation speed of the silicon single crystal ingot was 20 rpm, and for a case in which the rotation speed of the silicon single ingot was 12 rpm, under the conditions that the amount of inflow of the Ar gas was 70 lpm and the rotation speed of the quartz crucible was 0.1 rpm. A result of the observation is shown in FIG. 4c.

Figure 4C:
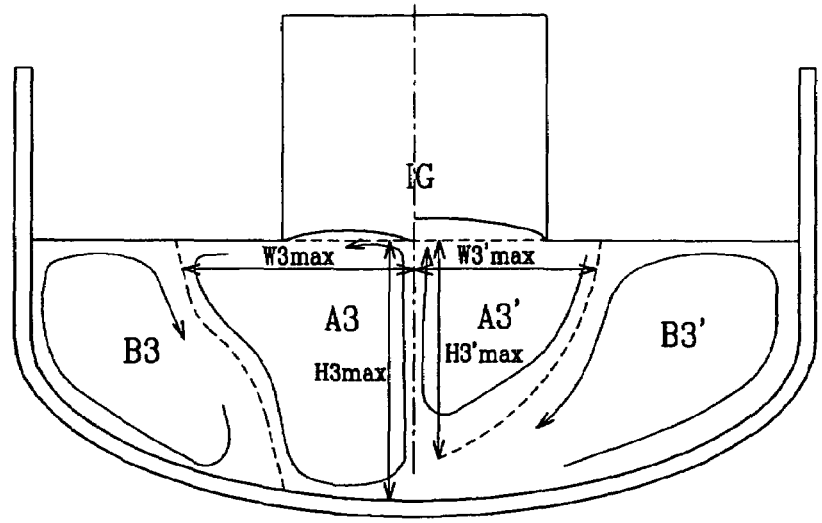
FIG. 4c is a schematic view showing convection distribution of a silicon melt in an experimental example 3.

In the case that the rotation speed of the silicon single crystal ingot was 20 rpm, the silicon melt was circulated in contact with a part of a center portion of the bottom of the quartz crucible in a state where maximal horizontal direction width W3max of core cell A3 was equal to or more than about 50% of the surface radius of the silicon melt, and maximal vertical direction depth H3max of core cell A3 was approximately 100% of the maximal depth of the silicon melt, as shown in the left side of FIG. 4c.

On the other hand, in the case that the rotation speed of the silicon single crystal ingot was 12 rpm, maximal horizontal direction width W3'max of core cell A3' occupied about 50% of the surface radius of the silicon melt, and maximal vertical direction depth H3'max of core cell A3' occupied about 90% of the maximal depth of the silicon melt, as shown in the right side of FIG. 4c.

Therefore, it can be seen that the size of outer cell B3' in the right side became larger than that of outer cell B3 in the left side.

Through experimental example 3 as described above, it can be seen that the size of the core cell of the convection distribution of the silicon melt can be enlarged by increasing the rotation speed of the silicon single crystal ingot.

From the results of experimental examples as described above, it can be seen that the size of the core cell of the convection distribution of the silicon melt can be enlarged by increasing the amount of inflow of the Ar gas, decreasing the rotation speed of the quartz crucible, or increasing the rotation speed of the silicon single crystal ingot.

On the contrary, the size of the core cell of the convection distribution of the silicon melt can be reduced by decreasing the amount of inflow of the Ar gas, increasing the rotation speed of the quartz crucible, or decreasing the rotation speed of the silicon single crystal ingot.

This means that the convection distribution of the silicon melt under the growth of the silicon single crystal ingot, i.e., relative size distribution of the core cell and the outer cell, can be properly controlled by adjustment of process variables, particularly the amount of inflow of the Ar gas, the rotation speed of the quartz crucible, or the rotation speed of the silicon single crystal ingot under growth.

However, the amount of inflow of the Ar gas, the rotation speed of the quartz crucible, or the rotation speed of the silicon single crystal ingot, which are process variables for controlling the relative size distribution of the core cell and the outer cell in the convection distribution of the silicon melt, are only examples. These process variables are not limitative, but other process variables can be adopted.

Now, the present invention will be described in more detail by way of exemplary embodiments.

Embodiment 1

In embodiment 1 of the present invention, the silicon single crystal ingot was grown under a state where the amount of inflow of the Ar gas flowing into the silicon single crystal ingot growth apparatus was 100 lpm, the rotation speed of the silicon single crystal ingot under growth was 18 rpm, and the rotation speed of the quartz crucible was 1.5 rpm.

According to embodiment 1, the maximal horizontal direction width Wmax of core cell Ao was about 45% of the surface radius of the silicon melt, and the maximal vertical direction depth Hmax of core cell Ao was about 80% of the maximal depth of the silicon melt.

Distribution of initial interstitial oxygen concentration [Oi] for a distance in a radial direction of a silicon wafer prepared by slicing and polishing the produced silicon single crystal ingot was measured. A result of the measurement is shown in FIG. 5a.

In addition, comparative example 1 for producing the silicon single crystal ingot according to the conventional method, as shown in FIG. 2, was carried out. Distribution of initial interstitial oxygen concentration [Oi] for a silicon wafer prepared from a silicon single crystal ingot produced in comparative example 1 was measured by the same method as in embodiment 1. A result of the measurement is shown in FIG. 6a.

Figure 5A:
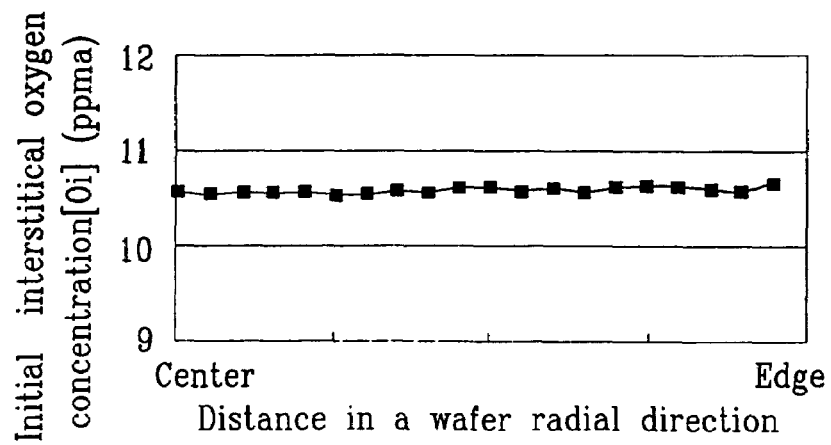
FIG. 5a is a graph showing a result of measurement of distribution of initial interstitial oxygen concentration [0i] with respect to a distance in a radial direction in the silicon wafer according to an embodiment of the present invention.

As shown in FIG. 5a, it can be confirmed that radial direction distribution of the initial interstitial oxygen concentration in the silicon wafer prepared according to an embodiment of the present invention exhibited a nearly uniform characteristic.

Figure 6A:
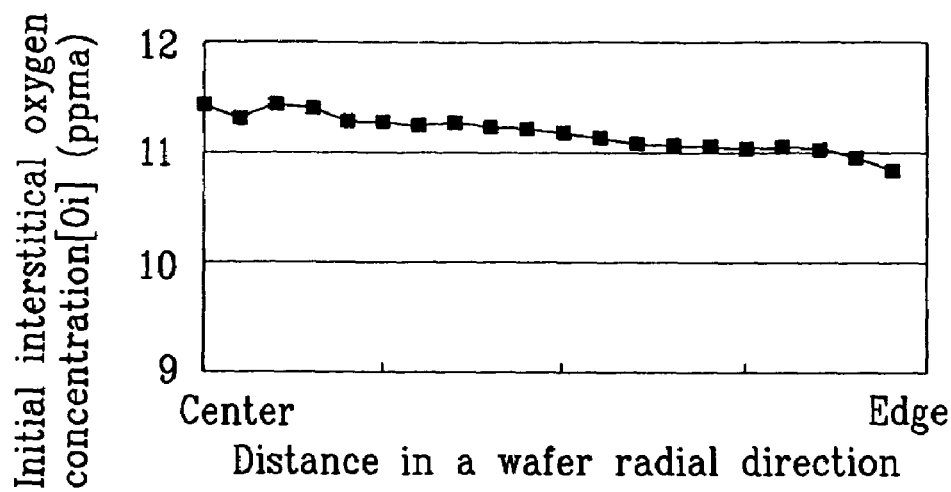
FIG. 6a is a graph showing a result of measurement of distribution of initial interstitial oxygen concentration [0i] with respect to a distance in a radial direction in the silicon wafer according to comparative example 1.

In contrast to this, as shown in FIG. 6a, it can be confirmed that the initial interstitial oxygen concentration in the radial direction in the silicon wafer prepared according to comparative example 1 was reduced from a center to an edge of the silicon wafer.

Next, for 10 silicon wafers prepared according to embodiment 1 of the present invention, the initial interstitial oxygen concentration at 20 points in each wafer was measured in order to obtain standard deviations. The obtained standard deviations are listed in Table 1.

For 10 silicon wafers prepared according to comparative example 1, the initial interstitial oxygen concentration was measured in the same way as in embodiment 1 in order to obtain standard deviations. The obtained standard deviations are also listed in Table 1 in units of ppma.

nitrogen and 5% oxygen, and then heat-treated at a temperature of 1000° C. for 16 hours in the same atmosphere as the first heat-treatment, the interstitial oxygen concentration was measured. The delta [Oi], which is a difference between the interstitial oxygen concentration before the heat-treatments and that after the heat-treatments, was measured for a distance in a wafer radial direction. A result of the measurement is shown in FIG. 5b.

The same heat-treatment was performed for comparative example 1. The delta [Oi] was measured for a distance in a wafer radial direction, and a result of the measurement is shown in FIG. 6b.

Figure 5B:
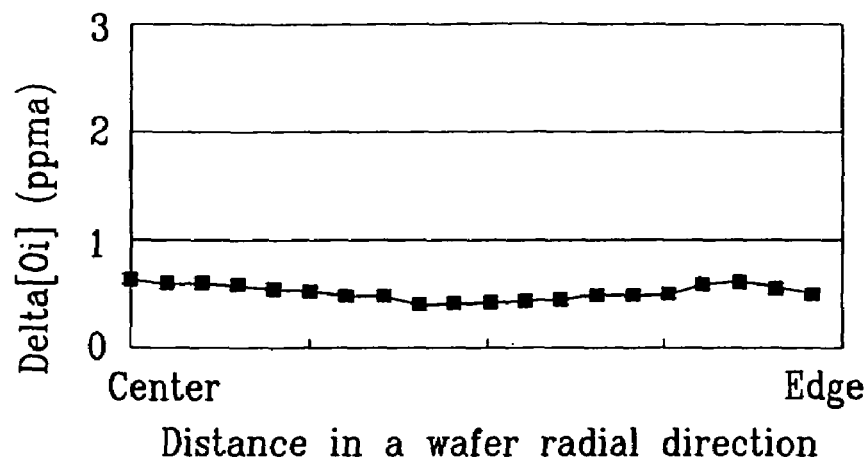
FIG. 5b is a graph showing a result of measurement of a delta [0i], which is a difference between interstitial oxygen concentration before heat-treatment and interstitial oxygen concentration after heat-treatment, with respect to a distance in a radial direction in the silicon wafer according to an embodiment of the present invention.

As shown in FIG. 5b, in the wafers prepared according to embodiment 1 of the present invention, it can be confirmed that the delta [Oi] was very uniform in a radial direction and a variation of the delta in the radial direction was equal to or less than 0.5 ppma.

Figure 6B:
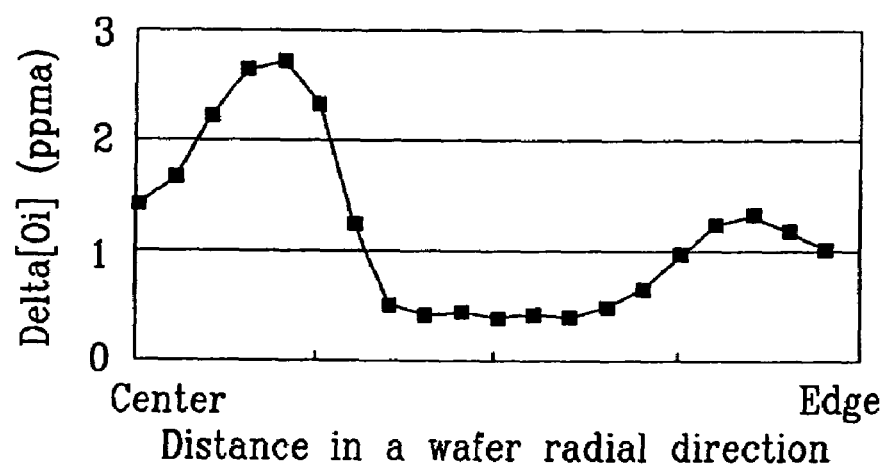
FIG. 6b is a graph showing a result of measurement of a delta [0i], which is a difference between interstitial oxygen concentration before heat-treatment and interstitial oxygen concentration after heat-treatment, with respect to a distance in a wafer radial direction in the silicon wafer according to comparative example 1.

On the contrary, as shown in FIG. 6b, in comparative example 1, it can be confirmed that the delta [Oi] was very nonuniform in the radial direction. This is because a center portion, a peripheral portion, and an intermediate portion between the center and peripheral portion in a liquid at the vicinity of the solid-liquid interface have different heat distributions during the crystal growth of the silicon single crystal ingot in the conventional method described earlier. Therefore, the silicon wafer obtained by processing the silicon single crystal ingot IG grown from the liquid also has nonuniform quality.

On the other hand, after the silicon wafer prepared according to embodiment 1 of the present invention also heat-treated under the above-mentioned conditions, MCLT scanning was performed. An image obtained as a result of the MCLT scanning is shown in FIG. 5c.

Figure 6C:
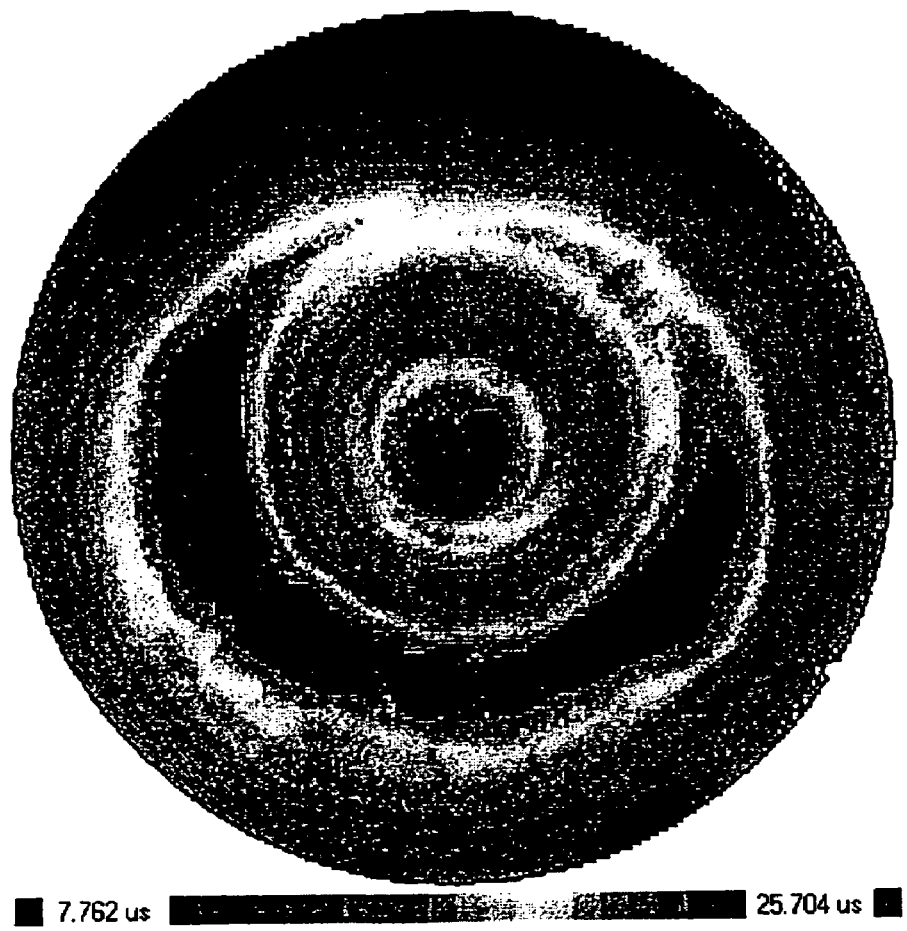
FIG. 6c is an image showing a result of MCLT scanning for the silicon wafer according to comparative example 1.

For comparative example 1, the MCLT scanning was performed in the same way as in embodiment 1. An image obtained as a result of the MCLT scanning is shown in FIG. 6c.

Figure 5C:
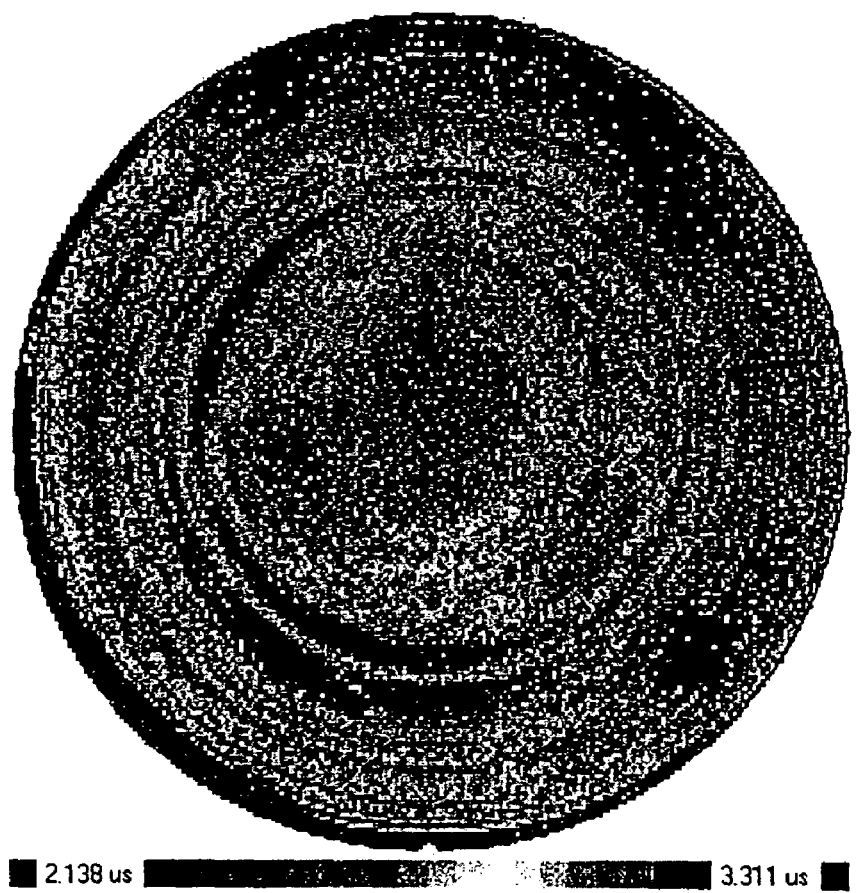
FIG. 5c is an image showing a result of MCLT scanning after heat-treatment for the silicon wafer according to an embodiment of the present invention.

As shown in FIG. 5c, the result of the MCLT scanning for the silicon wafer prepared according to embodiment 1 of the present invention shows a difference of 1.173 or so between

TABLE 1

| | Wafer | | | | | | | | | | |
|---|---|---|---|---|---|---|---|---|---|---|---|
| | 1 | 2 | 3 | 4 | 5 | 6 | 7 | 8 | 9 | 10 | Average |
| Embodiment 1 | 0.033 | 0.031 | 0.027 | 0.041 | 0.039 | 0.028 | 0.039 | 0.025 | 0.023 | 0.032 | 0.032 |
| | Wafer | | | | | | | | | | |
| | 1 | 2 | 3 | 4 | 5 | 6 | 7 | 8 | 9 | 10 | Average |
| Comparative example 1 | 0.161 | 0.173 | 0.159 | 0.181 | 0.175 | 0.163 | 0.167 | 0.180 | 0.188 | 0.176 | 0.172 |

As shown in Table 1, for embodiment 1 of the present invention, all standard deviations of in-plane initial interstitial oxygen concentration distribution of wafers are equal to or less than 0.041 ppma.

On the contrary, in comparative example 1, all standard deviations of in-plane initial interstitial oxygen concentration distribution of wafers exceed 0.1.6.

Next, after the wafers prepared according to embodiment 1 of the present invention were first heat-treated at a temperature of 800° C. for 4 hours under an atmosphere of 95% the maximal and minimal scale bars. It can be seen from this result that the wafer quality is very uniform.

On the other hand, as shown in FIG. 6c, the silicon Wafer prepared according to comparative example 1 shows a difference of about 18 between the maximal and minimal scale bars. This value is very large compared to embodiment 1 of the present invention. Accordingly, it can be seen that the quality of the wafer according to comparative example 1 was very nonuniform compared to embodiment 1 of the present invention.

Embodiment 2

A silicon single crystal ingot was grown under the conditions of experimental example 2 described earlier. Two conditions of experimental example 2 are defined as embodiment 2 and comparative example 2, respectively.

Namely, in embodiment 2, the silicon single crystal ingot was grown through the control of convection distribution of the silicon melt under the conditions that the amount of inflow of the Ar gas flowing into the silicon single crystal ingot growth apparatus was 70 lpm, the rotation speed of the silicon single crystal ingot under growth was 18 rpm, and the rotation speed of the quartz crucible was 0.5 rpm.

According to embodiment 2, the maximal horizontal direction width of the core cell of the convection distribution of the silicon melt occupied about 50% of the surface radius of the silicon melt, and the maximal vertical direction depth of the core cell occupied about 90% of the maximal depth of the silicon melt.

In comparative example 2, the silicon single crystal ingot was grown under the same conditions as in embodiment 2 for the amount of inflow of the Ar gas and the rotation speed of the silicon single crystal ingot, except that the rotation speed of the quartz crucible was 4 rpm.

According to comparative example 2, the maximal horizontal direction width of the core cell of the convection distribution of the silicon melt was not over an edge portion of the silicon single solid-liquid interface, and the maximal vertical direction depth of the core cell was less than 50% of the maximal depth of the silicon melt.

In embodiment 2 and comparative example 2, a comparison between yield (%) of embodiment 2 and that of comparative example 2 is listed in the following Table 2. Here, the yields are compared on the basis of a single crystallization ratio, which is referred to as a ratio of a single crystallized amount of silicon to an actual input amount of poly-crystalline silicon. In addition, an average yield comparison is listed in Table 2 after 10 of each silicon single crystal ingots were grown and measured.

TABLE 2

| | Rot number | | | | | | | | | | |
|---|---|---|---|---|---|---|---|---|---|---|---|
| | 1 | 2 | 3 | 4 | 5 | 6 | 7 | 8 | 9 | 10 | Average |
| Embodiment 2 | 80 | 80 | 62 | 80 | 80 | 80 | 80 | 80 | 80 | 80 | 78 |
| Comparative example 2 | 61 | 59 | 80 | 80 | 64 | 60 | 80 | 55 | 53 | 80 | 67 |

As shown in Table 2, in embodiment 2 of the present invention, the single crystallization ratios of silicon single crystal ingots reached 80% for the most part, and an average value reached about 78%. On the other hand, in comparative example 2, an average of the single crystallization ratios of silicon single crystal ingots reached 67%, which is relatively low.

Accordingly, it can be seen from Table 2 that embodiment 2 of the present invention achieves more single crystallization, i.e., a higher yield, by about 11% on average, compared to the conventional method.

As described above, the present invention provides a method for producing a silicon single crystal ingot based on a Czochralski method, which is capable of providing a silicon single crystal ingot having uniform quality in a radial direction and silicon wafers having uniform in-plane quality, by controlling convection distribution of a silicon melt within a quartz crucible such that distribution of concentration of oxygen flowing into the silicon single crystal ingot and distribution of point defects become uniform.

In addition, the present invention discovered that the convection distribution of the silicon melt should be controlled in order to grow a silicon single crystal ingot having uniform quality in the radial direction. Based on such a discovery, the present invention determined critical process variables for growing a silicon single crystal ingot having uniform quality in the radial direction by controlling the convection distribution through adjustment of an amount of inflow of an Ar gas, a rotation speed of the quartz crucible, a rotation speed of the silicon single crystal ingot, etc.

In addition, the present invention determined optimal process conditions for growing a silicon single crystal ingot having uniform quality in the radial direction.

Furthermore, the present invention increases semiconductor device yield, compared to conventional methods, which results in savings in production cost of silicon wafers.

Although exemplary embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A silicon wafer prepared from a silicon single crystal ingot grown by a Czochralski method, wherein a standard deviation of interstitial oxygen concentration distribution in a plane is equal to or less than 0.1 ppma and a point of defect concentration contained in the silicon wafer is $10^{11}$-$10^{13}$/cm$^3$.

2. The silicon wafer of claim 1, wherein an in-plane variation of delta interstitial oxygen concentration, which is a difference between interstitial oxygen concentration after firstly heat-treating the silicon wafer at a temperature of 800 C. for 4 hours in an atmosphere of 95% nitrogen and 5% oxygen and secondly heat-treating at a temperature of 1000 C. for 16 hours in an atmosphere of 95% nitrogen and 5% oxygen, and interstitial oxygen concentration before the first heat-treatment, is equal to or less than 0.5 ppma.

3. The silicon wafer of claim 1, wherein a difference between maximum and minimum of a scale bar in an image obtained by MCLT (minority carrier life time) scanning, after firstly heat-treating the silicon wafer at a temperature of 800 C. for 4 hours in an atmosphere of 95% nitrogen and 5% oxygen and secondly heat-treating the silicon wafer at a temperature of 1000 C. for 16 hours in an atmosphere of 95% nitrogen and 500 oxygen, is equal to or less than 10.

4. The silicon wafer of claim 3, wherein the difference between maximum and minimum of a scale bar in an image obtained by MCLT (minority carrier life time) scanning, after firstly heat-treating the silicon wafer at a temperature of 800 C. for 4 hours in an atmosphere of 95% nitrogen and 5% oxygen and secondly heat-treating the silicon wafer at a temperature of 1000 C. for 16 hours in an atmosphere of 95% nitrogen and 5% oxygen, is equal to or less than 5.

5. The silicon wafer of claim 4, wherein the difference between maximum and minimum of a scale bar in an image obtained by MCLT (minority carrier life time) scanning, after firstly heat-treating the silicon wafer at a temperature of 800 C. for 4 hours in an atmosphere of 95% nitrogen and 5% oxygen and secondly heat-treating the silicon wafer at a temperature of 1000 C. for 16 hours in an atmosphere of 95% nitrogen and 50% oxygen, is equal to or less than 3.

6. A silicon single crystal ingot wherein a standard deviation of interstitial oxygen concentration distribution in a radial direction of the silicon single crystal ingot is equal to or less than 0.1 ppma and a point defect concentration contained in the silicon single crystal ingot is $10^{11}$-$10^{13}$/cm$^3$.

* * * * *

UNITED STATES PATENT AND TRADEMARK OFFICE
CERTIFICATE OF CORRECTION

| | | |
|---|---|---|
| PATENT NO. | : 7,378,071 B2 | Page 1 of 1 |
| APPLICATION NO. | : 11/178096 | |
| DATED | : May 27, 2008 | |
| INVENTOR(S) | : Hyon-Jong Cho | |

It is certified that error appears in the above-identified patent and that said Letters Patent is hereby corrected as shown below:

Column 12, line 47, Claim 3    Delete "500", Insert --5%--

Column 12, line 63, Claim 5    Delete "50%", Insert --5%--

Signed and Sealed this

Nineteenth Day of May, 2009

JOHN DOLL
*Acting Director of the United States Patent and Trademark Office*